(12) United States Patent
Jaśkiewicz

(10) Patent No.: US 10,767,778 B2
(45) Date of Patent: Sep. 8, 2020

(54) SERVO VALVE

(71) Applicant: Hamilton Sundstrand Corporation, Charlotte, NC (US)

(72) Inventor: Zbigniew Jaśkiewicz, Wroclaw (PL)

(73) Assignee: HAMILTON SUNSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 16/224,837

(22) Filed: Dec. 19, 2018

(65) Prior Publication Data

US 2019/0195381 A1 Jun. 27, 2019

(30) Foreign Application Priority Data

Dec. 22, 2017 (EP) ..................................... 17461648

(51) Int. Cl.
| | | |
|---|---|---|
| *F16K 31/02* | (2006.01) | |
| *F16K 31/00* | (2006.01) | |
| *F15B 13/043* | (2006.01) | |
| *F16K 31/42* | (2006.01) | |
| *H01L 41/09* | (2006.01) | |

(52) U.S. Cl.
CPC .......... *F16K 31/006* (2013.01); *F15B 13/043* (2013.01); *F15B 13/0435* (2013.01); *F15B 13/0438* (2013.01); *F16K 31/007* (2013.01); *F16K 31/426* (2013.01); *H01L 41/0926* (2013.01)

(58) Field of Classification Search
CPC .... F16K 31/006; F16K 31/007; F16K 31/426; F15B 13/043; F15B 13/0435; F15B 13/0438; H01L 41/0926

USPC ... 137/487.5, 596.14, 596.16, 625.6, 625.64; 251/129.06, 129.01

See application file for complete search history.

(56) References Cited

U.S. PATENT DOCUMENTS

| | | | | |
|---|---|---|---|---|
| 2,800,143 A * | 7/1957 | Keller | ................. | F15B 13/0435 |
| | | | | 137/625.63 |
| 3,139,109 A * | 6/1964 | Ruchser | ................ | F15B 20/001 |
| | | | | 137/596.16 |
| 3,152,612 A * | 10/1964 | Avery | ................... | F16K 31/006 |
| | | | | 137/625.4 |

(Continued)

FOREIGN PATENT DOCUMENTS

| | | |
|---|---|---|
| CN | 2612829 Y | 4/2004 |
| DE | 4311216 A1 | 10/1994 |
| WO | 9714902 A1 | 4/1997 |

OTHER PUBLICATIONS

Extended European Search Report for International Application No. 17461648.2 dated Jun. 7, 2018, 10 pages.

*Primary Examiner* — Minh Q Le
(74) *Attorney, Agent, or Firm* — Cantor Colburn LLP

(57) ABSTRACT

A servo valve comprising first and second nozzles and first and second piezoelectric actuators arranged to control fluid flow through the first and second nozzles respectively. A first fluid flow path is defined between the first nozzle and the first piezoelectric actuator and a second fluid flow path is defined between the second nozzle and the second piezoelectric actuator. The first and second piezoelectric actuators are arranged such that applying a voltage to the first and second piezoelectric actuators causes a change in dimension thereof, which acts to open or restrict said first and second fluid flow paths respectively.

13 Claims, 2 Drawing Sheets

(56) References Cited

U.S. PATENT DOCUMENTS

| | | | | |
|---|---|---|---|---|
| 3,200,845 | A * | 8/1965 | Masaya | F15B 13/0402 137/625.6 |
| 3,996,956 | A * | 12/1976 | Taft | F15B 13/043 137/119.1 |
| 4,067,357 | A * | 1/1978 | Ruchser | F15B 13/0405 137/596.15 |
| 4,114,650 | A * | 9/1978 | Gordon | F15B 13/0402 137/625.63 |
| 4,266,572 | A * | 5/1981 | Schuttenberg | F15B 13/0402 137/625.63 |
| 4,285,363 | A * | 8/1981 | Kolm | F15B 13/0438 137/596.17 |
| 4,473,095 | A * | 9/1984 | Motzer | F15B 20/001 137/596.16 |
| 4,510,973 | A * | 4/1985 | Balaskas | F15B 13/042 137/596.18 |
| 4,705,059 | A * | 11/1987 | Lecerf | F15B 13/0438 137/625.61 |
| 4,959,581 | A | 9/1990 | Dantlegraber | |
| 5,085,399 | A * | 2/1992 | Tsutsui | G05D 23/1393 251/30.03 |
| 5,148,735 | A * | 9/1992 | Veletovac | H02N 2/0075 91/459 |
| 5,156,189 | A * | 10/1992 | Tranovich | F15B 13/043 137/625.63 |
| 5,709,245 | A * | 1/1998 | Miller | F15B 13/0438 137/625.62 |
| 8,082,952 | B2 | 12/2011 | Veilleux | |
| 9,115,730 | B2 * | 8/2015 | Schulz | F15B 13/0435 |
| 9,447,797 | B2 | 9/2016 | Sangiah et al. | |
| 2003/0221730 | A1 * | 12/2003 | Porter | F15B 11/042 137/625.64 |
| 2007/0045579 | A1 * | 3/2007 | Wirtl | G05D 16/163 251/129.04 |
| 2007/0075286 | A1 * | 4/2007 | Tanner | F16K 11/07 251/129.06 |
| 2009/0114286 | A1 * | 5/2009 | DuPuis | F16K 31/004 137/14 |
| 2012/0216896 | A1 | 8/2012 | Hayashi et al. | |
| 2016/0161013 | A1 | 6/2016 | Brooks et al. | |
| 2017/0227026 | A1 | 8/2017 | Chaudhary et al. | |

\* cited by examiner

SERVO VALVE

FOREIGN PRIORITY

This application claims priority to European Patent Application No. 17461648.2 filed Dec. 22, 2017, the entire contents of which is incorporated herein by reference.

TECHNICAL FIELD

This disclosure relates to a servo valve. This disclosure also relates to an actuation system and a method of controlling a servo valve.

BACKGROUND

Servo valves are well-known in the art and can be used to control the flow of hydraulic fluid to an actuator via a spool valve. Typically, a flapper is deflected by an armature connected to an electric motor away or towards nozzles, which control fluid flow to the spool valve. Deflection of the flapper can control the amount of fluid injected from the nozzles, and thus the amount of fluid communicated to the actuator via the spool valve. In this way, servo valves can allow precise control of actuator movement.

SUMMARY

From one aspect, the present disclosure relates to a servo valve in accordance with claim 1.

The piezoelectric actuators may be configured such that the change in dimension fully opens the fluid flow paths (i.e. the nozzles are unobstructed by the piezoelectric actuators) or fully closes the fluid flow paths (i.e. the nozzles are completely blocked/restricted by the piezoelectric actuators). Additionally or alternatively, the piezoelectric actuators may be configured to only partially block/restrict the nozzles and/or only partially open the nozzles.

The first and second nozzles may be in fluid communication with a spool valve that controls a hydraulic actuator. The spool position may be varied by restricting or opening the first and/or second fluid flow paths.

In an embodiment of the above servo valve, the first and second piezoelectric actuators are arranged such that the change in dimension thereof increases or decreases a gap between the first and second piezoelectric actuators and the first and second nozzles respectively. The increase or decrease in gap can open or restrict the first and second fluid paths respectively. The gap can be increased until the fluid flow paths are "fully open" and decreased until the fluid flow paths are "fully closed", or to some other (intermediate) degree of open or closed.

In a further embodiment of either of the above servo valves, the first and second nozzles define first and second nozzle axes. The first and second piezoelectric actuators extend along the first and second nozzle axes respectively, and the change in dimension of the first and second piezoelectric actuators causes the first and second piezoelectric actuators to expand or contract along the first and second nozzle axes respectively. The first and second nozzle axes may be aligned with each other. The nozzle axis may be defined as the axis along which fluid flows through nozzle outlet openings of the nozzles (i.e. a central axis of the nozzle outlet openings).

In a further embodiment of any of the above servo valves, each piezoelectric actuator comprises a piezoelectric element and a blocking element. The blocking element is at a first axial end of the piezoelectric element facing the respective nozzle. The blocking element comprises a surface for engaging a nozzle outlet opening in the respective nozzle. The surface may be planar in a plane perpendicular to the nozzle axis/fluid flow path out of the nozzle outlet opening (i.e. the central axis of the nozzle outlet openings).

In a further embodiment of any of the above servo valves, the servo valve further comprises a servo valve housing including a pair of nozzle cavities. Each nozzle cavity houses a nozzle and a piezoelectric actuator.

In a further embodiment of the above servo valve, the piezoelectric actuators are retained in the nozzle cavities by contact between a second axial end of each piezoelectric actuator opposite a or the first axial end facing the nozzle, and a wall defined by the respective nozzle cavity. The wall may be a common wall shared by the first and second cavities. The wall may separate the first and second cavities.

In a further embodiment of any of the above servo valves, the servo valve further comprises a first pair of caps each configured to hermetically seal a respective nozzle cavity from the exterior of the servo valve housing. The caps are removably secured to the servo valve housing to allow access to the nozzles and the piezoelectric actuators.

In a further embodiment of any of the above servo valves, the servo valve housing further includes a spool cavity housing a spool. The spool has a central spool axis, a first axial end and an opposing second axial end. The spool is configured to translate axially along the spool axis in response to a fluid bias being placed on the spool between the first and second axial ends of the spool. The servo valve further comprises a pair of opposing spool biasing members in contact with the first and second axial ends of the spool respectively. The biasing members are configured to oppose axial translation of the spool along the central spool axis.

In a further embodiment of any of the above servo valve, the servo valve further comprises a supply port, a return port, and first and second control ports. The supply port is upstream of the first and second nozzle cavities in fluid communication with the first and second fluid flow paths via the first and second axial ends of the spool and respective first and second inlet orifices. The return port is downstream of the nozzle cavities in fluid communication with the first and second fluid flow paths and the spool. The first and second control ports are for providing fluid communication between the spool and a hydraulic actuator.

In a further embodiment of any of the above servo valves, the servo valve is configured such that each piezoelectric actuator is independently controllable. The piezoelectric actuators may be configured such that one expands/contracts by a different extent to the other (e.g. by supplying a different amount of voltage to the other or providing one piezoelectric actuator with a different piezoelectric coefficient to the other, to provide a differential rate of expansion/contraction for a given voltage). The first and second piezoelectric actuators may be configured such that they experience changes in dimensions in opposite directions, i.e. as one piezoelectric actuator expands in the axial direction, thus opening the nozzle/gap, the other contracts, thus closing the nozzle/gap (e.g. by supplying voltages of opposite polarity to the piezoelectric actuators). Alternatively, the piezoelectric actuators may be configured to act in the same manner at the same time, i.e. both expanding or contracting concurrently in response to independent control (e.g. by supplying the same voltage to each piezoelectric actuator).

From another aspect, the present disclosure relates to an actuation system comprising the servo valve according to the aspect, or any embodiment thereof, described above, and a hydraulic actuator in fluid communication therewith, such that the servo valve controls the actuator.

From yet another aspect, the present disclosure relates to an actuation system in accordance with claim 11.

From yet another aspect, the present disclosure relates to a method of controlling a servo valve in accordance with claim 13.

In an embodiment of the above method, the method further comprises supplying voltage to each piezoelectric actuator independently to change the axial dimension of each piezoelectric actuator independently.

In a further embodiment of the above method, the servo valve has a spool having a central spool axis, a first axial end and an opposing second axial end, the first nozzle is in fluid communication with the first axial end of the spool, and the second nozzle is in fluid communication with the second axial end of the spool, the method further comprising generating a fluid bias between the first and second axial ends of the spool by the opening or restricting of said first and second fluid flow paths by the first and second piezoelectric actuators respectively.

It is to be understood, in any of the above aspects or embodiments thereof, that the amount of dimensional change of the piezoelectric actuators varies given the amount of voltage supplied, and that the direction of dimensional change (expansion or contraction) will change depending on voltage polarity.

It is also to be understood that in any of the above aspects or embodiments thereof, independent control of the piezoelectric actuator means the first and second fluid flow paths can be independently opened and restricted/closed. In other words, each piezoelectric actuator can be actuated separately from the other. This may be achieved by having a separate voltage supply for each piezoelectric actuator or by providing a common voltage supply that allows independent switching on and off of each piezoelectric actuator, e.g. using an electronic control. The voltage supplied to each piezoelectric actuator may be positive or negative (i.e. of any polarity), depending on the dimension change desired (i.e. expansion or contraction).

BRIEF DESCRIPTION OF DRAWINGS

Some exemplary embodiments of the present disclosure will now be described by way of example only, and with reference to the following drawings in which.

DETAILED DESCRIPTION

Figure 1:
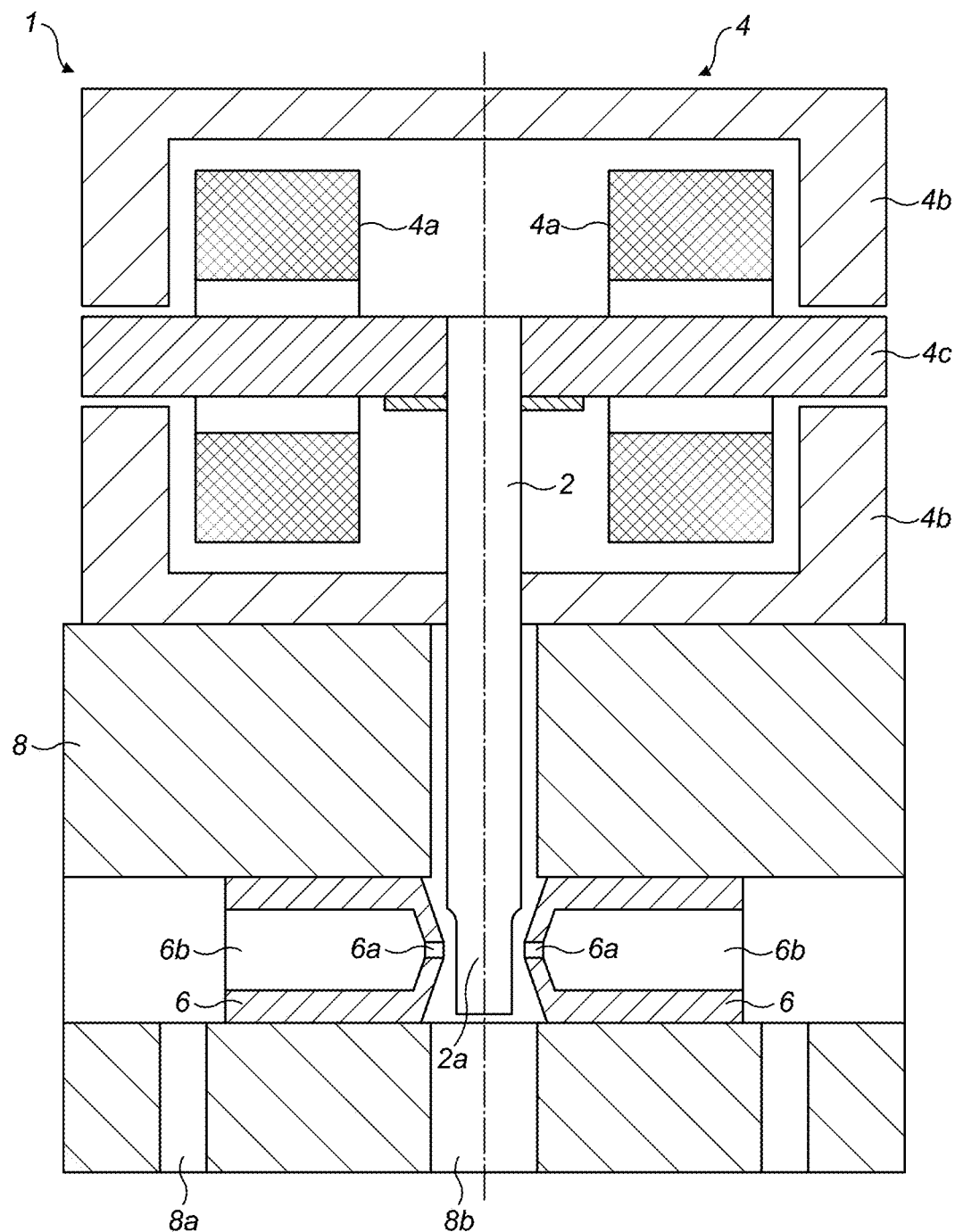
FIG. 1 shows an example of a prior art servo valve.

With reference to FIG. 1, a prior art servo valve 1 is illustrated. Servo valve 1 comprises an electric motor 4, flapper 2, nozzles 6 and nozzle housing 8. The electric motor 4 comprises coils 4a, permanent magnets 4b and armature 4c. The coils 4a are in electrical communication with an electrical supply (not shown) and when activated, interact with the permanent magnets 4b to create movement of armature 4c, as is known in the art. Flapper 2 is attached to armature 4c, and is deflected by movement of the armature 4c. Nozzles 6 are housed within nozzle housing 8 via an interference fit and comprise a fluid outlet 6a and fluid inlet 6b. Housing 8 also has a port 8a, which allows communication of fluid to the nozzles 6. The flapper 2 comprises a blocking element 2a at an end thereof which interacts with fluid outlets 6a of nozzles 6 to provide metering of fluid from the fluid outlets 6a to a fluid port 8b in the housing 8, which allows communication of metered fluid from the nozzles 6 to an actuator via a spool valve input (not shown). As is known in the art, the electric motor 4 is used to control deflection of the blocking element 2a and vary the fluid delivered to the actuator from nozzles 6, as required.

Figure 2:
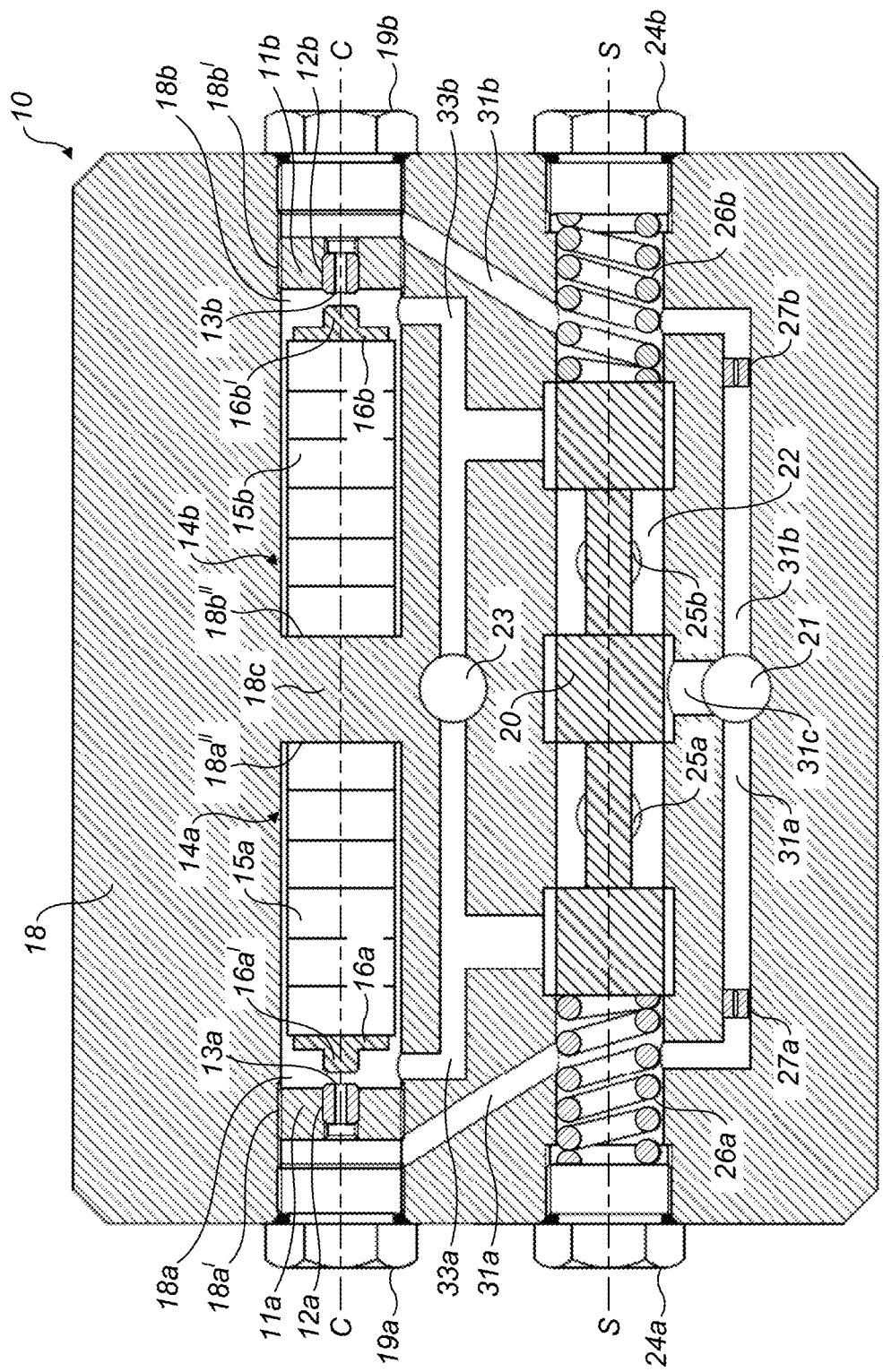
FIG. 2 shows a cross-sectional view of an embodiment of a servo valve in accordance with this disclosure.

With reference to FIG. 2, a servo valve 10 is illustrated, in accordance with an embodiment of the present disclosure. Servo valve 10 comprises a pair of opposed nozzles 12a, 12b, a pair of opposed piezoelectric actuators 14a, 14b, and a servo valve housing 18. The nozzles 12a, 12b are axially spaced apart and aligned along a common nozzle axis C. Each nozzle 12a, 12b has an outlet opening 13a, 13b centred on the nozzle axis C. The piezoelectric actuators 14a, 14b are co-axial with the nozzle axis C. Each piezoelectric actuator 14a, 14b comprises a piezoelectric element 15a, 15b and a blocking element 16a, 16b attached at an axial outer end thereof relative to the nozzle axis C, such that each blocking element 16a, 16b is positioned adjacent a respective one of the nozzle outlet openings 13a, 13b, between the nozzle outlet opening 13a, 13b and the piezoelectric element 15a, 15b it is attached to. The piezoelectric actuators 14a, 14b are used to interact with the nozzle outlet openings 13a, 13b, as will be discussed below.

Although in the depicted embodiment, blocking elements 16a, 16b are separate components attached to the piezoelectric elements 15a, 15b, within the scope of this disclosure, blocking elements 16a, 16b could also be integrally formed with the piezoelectric elements 15a, 15b.

Although the nozzles 12a, 12b, outlet openings 13a, 13b and piezoelectric actuators 14a, 14b are depicted in the illustrated embodiment as co-axial along a common nozzle axis C, it is to be understood, that within the scope of this disclosure, this need not be the case. For instance, in other embodiments, the pair of nozzles 12a, 12b need not be axially aligned with each other or axially spaced apart from each other. Instead, each nozzle 12a, 12b (and respective outlet opening 13a, 13b) may have separate nozzle axes, which are not aligned or co-axial with the other. Piezoelectric actuators 14a, 14b may be aligned with a respective one of each separate nozzle axes. In this manner, more flexibility is provided for the positioning of each nozzle 12a, 12b and piezoelectric actuator 14a, 14b.

The servo valve housing 18 comprises first and second nozzle cavities 18a, 18b, which are axially separated from each other by an axially and radially extending wall 18c, which is common to the nozzle cavities 18a, 18b and axially centred between them relative to the nozzle axis C. The first nozzle cavity 18a houses the first nozzle 12a and the first piezoelectric actuator 14a, whilst the second nozzle cavity 18b houses the second nozzle 12b and the second piezoelectric actuator 14b. In this manner, the nozzles 12a, 12b and the piezoelectric actuators 14a, 14b form pairs, in a respective nozzle cavity 18a, 18b. In embodiments where the nozzles 12a, 12b do not share a common axis, the cavities 18a, 18b may be separated by one or more different walls.

The nozzles 12a, 12b are held in place by respective nozzle retainers 11a, 11b, which are secured against respective axially extending internal surfaces 18a', 18b' defined by each nozzle cavity 18a, 18b, which are positioned radially outward from and extend parallel to the nozzle axis C. The piezoelectric actuators 14a, 14b are retained by the wall 18c, and more specifically, by contact between respective first axial ends of the piezoelectric elements 15a, 15b and radially extending internal surfaces 18a", 18b" on opposite axial sides of the wall 18c. The blocking elements 16a, 16b are attached to the piezoelectric elements 15a, 15b at opposite axial ends of the piezoelectric actuators 14a, 14b than those that are in contact with the wall 18c (i.e. the axial ends adjacent the nozzle outlet openings 13a, 13b rather than adjacent the wall 18c).

Nozzle cavities 18a, 18b extend through the servo valve housing 18 from the exterior of the housing 18. Caps 19a, 19b are used to hermetically seal the cavities 18a, 18b from the exterior of the servo valve housing 18. In embodiments, the caps 19a, 19b are removable, such that the nozzle cavities 18a, 18b can be accessed easily for maintenance purposes. For instance, caps 19a, 19b may be in screw threaded engagement with the servo valve housing 18

The piezoelectric actuators 14a, 14b each comprise at least one piezoelectric material, and are configured such that an electrical signal can be supplied to each piezoelectric actuator 14a, 14b separately, for instance, using separate power supplies (not shown). In the depicted embodiment, the piezoelectric actuators 14a, 14b comprise a piezoelectric stack. As will be appreciated by one skilled in the art, application of an electrical signal to the piezoelectric actuators 14a, 14b will result in a change in dimension in the piezoelectric material, which can be used to move blocking elements 16a, 16b in an axial direction parallel and co-axial with the nozzle axis C. In this manner, energisation of the piezoelectric actuators 14a, 14b allows axial translation of the blocking elements 16a, 16b along the nozzle axis C. As will be understood by the skilled person, the degree of axial translation can be adjusted by varying the amount of voltage/current used to energise the piezoelectric actuators 14a, 14b. In this manner, piezoelectric actuators 14a, 14b can be used to adjust the axial distance between the first blocking element 16a and the first nozzle outlet opening 13a, and between the second blocking element 16b and the second nozzle outlet opening 13b, in order to control the amount of fluid flow through the nozzles 12a, 12b. To control the fluid flow more accurately, the first and second blocking elements 16a, 16b comprise protrusions 16a', 16b' that extend axially therefrom relative to the nozzle axis C towards the nozzles 12a, 12b, and which have a planar (i.e. flat) surface in a plane perpendicular to the nozzle axis C, facing the respective nozzle 12a, 12b. Within the scope of this disclosure, any suitable type of piezoelectric actuator, including any suitable material piezoelectric material, may be used.

Servo valve 10 further comprises a spool valve assembly. Spool valve assembly includes a spool 20 having a central spool axis S. Servo valve housing 18 houses the spool 20 in a spool cavity 22 that is in fluid communication with the nozzle outlet openings 13a, 13b via first and second opposing axial ends of the spool 20. Spool 20 is configured to translate axially along the spool axis S, within the spool cavity 22, in response to a fluid bias being placed on the spool 20 between the first and second axial ends due to the changes in fluid flow communicated through the nozzles 12a, 12b.

In the same manner as the nozzle cavities 18a, 18b, spool cavity 22 also extends from the exterior of the housing 18, and a second pair of caps 24a, 24b are used to hermetically seal opposing ends of the spool cavity 22 from the exterior of the servo valve housing 18. Caps 24a, 24b may also be removable, for instance, by being in screw threaded engagement with the servo valve housing 18.

A pair of opposing spool biasing members 26a, 26b are housed in the spool cavity 22, and each biasing member 26a, 26b is disposed and retained between the first and second axial ends of the spool 20 and caps 24a, 24b respectively. The spool biasing members 26a, 26b are configured to bias the spool 20 to a central "neutral" axial position in the spool cavity 22 relative to the spool axis S. In this manner, biasing members 26a, 26b resist axial translation of the spool 20 from the central "neutral" position.

Servo valve 10 further comprises a supply port 21 for supplying fluid to the nozzle outlets 13a, 13b from a fluid supply (not shown), a return port 23 for returning fluid from the nozzle outlet openings 13a, 13b back to the fluid supply, and first and second control ports 25a, 25b for delivering fluid from the spool cavity 22 to an actuator (not shown).

The supply port 21 is fluidly connected to the nozzle outlets 13a, 13b by respective channels 31a, 31b, that extend through the servo valve housing 18. Channels 31a, 31b pass through the spool cavity 22 between the outer axial ends of the spool 20 and the caps 24a, 24b. A third channel 31c also allows fluid to be directly communicated from the supply port 21 to the spool cavity 22, without passing through the nozzles 12a, 12b. Inlet orifices 27a, 27b are placed in the channels 31a, 31b to help communicate a fluid pressure volume to the nozzles 12a, 12b. The return port 23 is fluidly connected to the nozzle outlet openings 13a, 13b by respective channels 33a, 33b, which each extend from the nozzle cavities 18a, 18b to the spool cavity 22, allowing fluid communication thereto from the nozzle outlet openings 13a, 13b.

As will be understood by the skilled person, by adjusting the axial positioning of the blocking elements 16a, 16b by selectively energising the piezoelectric actuators 14a, 14b, the fluid pressure bias communicated to the spool 20 can be controlled. This, in turn, controls the axial positioning of the spool 20 in the spool cavity 22, which controls the amount of fluid communicated to the actuator via the control ports 25a, 25b. In this manner, a relatively small movement of the piezoelectric actuators 14a, 14b and blocking elements 16a, 16b can produce a highly amplified movement of the actuator.

It is to be appreciated that by replacing the electric motor 4 and flapper 2 of the prior art with the piezoelectric actuators 14a, 14b of this disclosure, a much more compact "pilot stage" of a servo valve can be realised, which reduces weight, size and complexity. Such reductions in weight and size are particularly advantageous in aerospace applications. In addition, the use of piezoelectric actuators 14a, 14b allows for a more sensitive servo valve 10 that can make finer and more accurate adjustments than an assembly controlled by an electric motor 4 and flapper 2 system. Moreover, the ability to control individual piezoelectric actuators 14a, 14b to dictate the fluid injected from individual nozzles 12a, 12b, not only allows flexible positioning of the nozzles 12a, 12b and actuators 14a, 14b within the servo valve 10, but also allows even finer calibration of the fluid bias exerted on the spool 20. In particular, it is known that the flow characteristics through the nozzles can be different when a current supplied to a piezoelectric actuator is increased compared to when the current supplied is instead decreased. By having two individual piezoelectric actuators 14a, 14b, such differences can be compensated for.

The invention claimed is:

1. A servo valve comprising:
   first and second nozzles; and
   first and second piezoelectric actuators arranged to control fluid flow through the first and second nozzles respectively, wherein:
      a first fluid flow path is defined between the first nozzle and the first piezoelectric actuator;
      a second fluid flow path is defined between the second nozzle and the second piezoelectric actuator; and the first and second piezoelectric actuators are arranged such that applying a voltage to the first and second piezoelectric actuators causes a change in dimension thereof, which acts to open or restrict said first and second fluid flow paths respectively; and the servo valve further comprising:

a servo valve housing including a pair of nozzle cavities, each housing a respective nozzle and piezoelectric actuator, wherein the piezoelectric actuators are retained in the nozzle cavities by contact between a first axial end of each piezoelectric actuator opposite a second axial end facing the nozzle and a wall defined by the respective nozzle cavity, wherein the wall is a common wall shared by the first and second nozzle cavities and separating the first and second nozzle cavities.

2. The servo valve of claim 1, wherein the first and second piezoelectric actuators are arranged such that the change in dimension thereof increases or decreases a gap between the first and second piezoelectric actuators and the first and second nozzles respectively.

3. The servo valve of claim 1, wherein the first and second nozzles define first and second nozzle axes, the first and second piezoelectric actuators extend along the first and second nozzle axes respectively, and the change in dimension of the first and second piezoelectric actuators causes the first and second piezoelectric actuators to expand or contract along the first and second nozzle axes respectively.

4. The servo valve of claim 3, wherein the first and second nozzle axes are aligned with each other.

5. The servo valve of claim 1, wherein each piezoelectric actuator comprises a piezoelectric element and a blocking element, the blocking element is at the second axial end of the piezoelectric actuator facing the respective nozzle, and comprises a surface for engaging a nozzle outlet opening in the respective nozzle.

6. The servo valve of claim 1, further comprising a first pair of caps each configured to hermetically seal a respective one of the pair of nozzle cavities from the exterior of the servo valve housing, wherein the caps are removably secured to the servo valve housing.

7. The servo valve of claim 1, wherein the servo valve housing further includes a spool cavity housing a spool, wherein the spool has a central spool axis, a first axial end and an opposing second axial end, and the spool is configured to translate axially along the spool axis in response to a fluid bias being placed on the spool between the first and second axial ends of the spool, and the servo valve further comprises a pair of opposing spool biasing members in contact with the first and second axial ends of the spool respectively, wherein the biasing members are configured to oppose axial translation of the spool along the central spool axis.

8. The servo valve of claim 7, further comprising:

a supply port upstream of the first and second nozzle cavities in fluid communication with the first and second fluid flow paths via the first and second axial ends of the spool and respective first and second inlet orifices;

a return port downstream of the nozzle cavities in fluid communication with the first and second fluid flow paths and the spool; and first and second control ports for providing fluid communication between the spool and a hydraulic actuator.

9. An actuation system comprising:

the servo valve of claim 8; and a hydraulic actuator in fluid communication with the first and second control ports.

10. The servo valve of claim 1, wherein the servo valve is configured such that each piezoelectric actuator is independently controllable.

11. A method of controlling a servo valve having first and second nozzles and first and second piezoelectric actuators, wherein a first fluid flow path is defined between the first nozzle and the first piezoelectric actuator and a second fluid flow path is defined between the second nozzle and the second piezoelectric actuator, the method comprising supplying a voltage to first and second piezoelectric actuators causing a change in dimension thereof which opens or restricts the first and second fluid flow paths defined between the first and second nozzles and first and second piezoelectric actuators respectively; and the servo valve also having:

a servo valve housing including a pair of nozzle cavities, each housing a respective nozzle and piezoelectric actuator, wherein the piezoelectric actuators are retained in the nozzle cavities by contact between a first axial end of each piezoelectric actuator opposite a second axial end facing the nozzle and a wall defined by the respective nozzle cavity, wherein the wall is a common wall shared by the first and second nozzle cavities and separating the first and second nozzle cavities.

12. The method of claim 11, further comprising supplying voltage to each piezoelectric actuator independently to change the axial dimension of each piezoelectric actuator independently.

13. The method of claim 12, wherein the servo valve has a spool having a central spool axis, a first axial end and an opposing second axial end, the first nozzle is in fluid communication with the first axial end of the spool, and the second nozzle is in fluid communication with the second axial end of the spool, the method further comprising generating a fluid bias between the first and second axial ends of the spool by the opening or restricting of said first and second fluid flow paths by the first and second piezoelectric actuators respectively.

* * * * *